(12) United States Patent
Kim et al.

(10) Patent No.: US 9,935,267 B2
(45) Date of Patent: Apr. 3, 2018

(54) VARIABLE RESISTANCE MEMORY DEVICE WITH VARIABLE RESISTANCE MATERIAL LAYER

(71) Applicant: SK hynix Inc., Gyeonggi-do (KR)

(72) Inventors: Min Seok Kim, Gyeonggi-do (KR); Hyo Seob Yoon, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 36 days.

(21) Appl. No.: 15/094,151

(22) Filed: Apr. 8, 2016

(65) Prior Publication Data
US 2016/0225985 A1 Aug. 4, 2016

Related U.S. Application Data

(62) Division of application No. 14/046,403, filed on Oct. 4, 2013, now Pat. No. 9,337,420.

(30) Foreign Application Priority Data

Jun. 21, 2013 (KR) .................. 10-2013-0071496

(51) Int. Cl.
H01L 45/00 (2006.01)

(52) U.S. Cl.
CPC .......... *H01L 45/1683* (2013.01); *H01L 45/06* (2013.01); *H01L 45/1233* (2013.01);
(Continued)

(58) Field of Classification Search
CPC . H01L 45/1683; H01L 45/1233; H01L 45/06; H01L 45/1246; H01L 45/144; H01L 45/1675; H01L 45/122; H01L 45/1253
(Continued)

(56) References Cited

U.S. PATENT DOCUMENTS 8,933,430 B1* 1/2015 Jung .................. H01L 45/1683
257/295
9,190,613 B2* 11/2015 Jung .................. H01L 45/1683
(Continued)

FOREIGN PATENT DOCUMENTS

CN 102468436 5/2012
JP 2010-161376 7/2010
(Continued)

OTHER PUBLICATIONS

Office Action issued by the United States Patent and Trademark Office for U.S. Appl. No. 15/094,110 in the same family tree dated May 4, 2017.

*Primary Examiner* — Joseph C Nicely
*Assistant Examiner* — Pavel Ivanov
(74) *Attorney, Agent, or Firm* — IP & T Group LLP

(57) ABSTRACT

A variable resistance memory device and a method of manufacturing the same are provided. The variable resistance memory device may include a multi-layered insulating layer formed on a semiconductor substrate, on which a lower electrode is formed. The multi-layered insulating layer may include a first hole and a second hole, concentrically formed therein, to expose the lower electrode, wherein a diameter of the first hole is larger than a diameter of the second hole. A variable resistance material layer may be formed in the second hole to contact the lower electrode, and an upper electrode may be formed in the first hole to contact the variable resistance material layer.

9 Claims, 6 Drawing Sheets

(52) U.S. Cl.
CPC ........ *H01L 45/1246* (2013.01); *H01L 45/144* (2013.01); *H01L 45/1675* (2013.01)

(58) Field of Classification Search
USPC .............................................. 257/3; 438/382
See application file for complete search history.

(56) References Cited

U.S. PATENT DOCUMENTS

| | | | |
|---|---|---|---|
| 2007/0054448 A1* | 3/2007 | Choi ................ | H01L 21/28273 438/201 |
| 2008/0265238 A1 | 10/2008 | Chen et al. | |
| 2010/0072446 A1 | 3/2010 | Kim et al. | |
| 2010/0078621 A1* | 4/2010 | Breitwisch .............. | H01L 45/06 257/4 |
| 2011/0057162 A1* | 3/2011 | Breitwisch .............. | H01L 45/06 257/3 |
| 2011/0284815 A1* | 11/2011 | Kim ........................ | H01L 45/06 257/4 |
| 2013/0112935 A1* | 5/2013 | Himeno .............. | H01L 45/1253 257/4 |
| 2015/0014621 A1* | 1/2015 | Jung ................... | H01L 45/1683 257/4 |
| 2015/0076441 A1* | 3/2015 | Jung ................... | H01L 45/1683 257/4 |

FOREIGN PATENT DOCUMENTS

| | | | | |
|---|---|---|---|---|
| TW | 201143084 | 12/2012 | | |
| WO | WO 2012/074131 | 6/2012 | | |
| WO | WO 2012073503 A1 * | 6/2012 | ......... | H01L 45/1253 |

\* cited by examiner

VARIABLE RESISTANCE MEMORY DEVICE WITH VARIABLE RESISTANCE MATERIAL LAYER

CROSS-REFERENCES TO RELATED APPLICATION

This application is a divisional of U.S. patent application Ser. No. 14/046,403 filed on Oct. 4, 2013, which claims priority under 35 U.S.C. 119(a) to Korean application number 10-2013-0071496, filed on Jun. 21, 2013, in the Korean Patent Office. The disclosure of each of the foregoing applications is incorporated by reference in its entirety.

BACKGROUND OF THE INVENTION

1. Technical Field

Various implementations relate to a nonvolatile memory device, and more particularly, to a variable resistance memory device and a method of manufacturing the same.

2. Related Art

In recent years, with demands on semiconductor devices with high performance and low power, next generation semiconductor memory devices with non-volatility and non-refresh have been researched. As one of the next-generation semiconductor memory devices, variable resistance memory devices are suggested, and there are phase-change random access memory devices (PCRAMs), resistive RAMs (ReRAMs), magnetic RAMs (MRAMs), spin-transfer torque magnetoresistive RAMs (STTMRAMs), or polymer RAMs (PoRAMs), as the variable resistance memory devices.

The variable resistance memory devices perform a memory operation to have a set state or a reset state by controlling a phase-change material, which constitutes a data storage unit, to a crystalline state or an amorphous state.

Attempts to reduce a reset current, that is, a current required to switch a phase-change material to an amorphous state in PCRAMs have been made. Reduction in the reset current of the PCRAMs may be determined by a resistance of the phase-change material layer and a contact area between a lower electrode and the phase-change material layer.

Thus, at present, attempts to reduce the contact area between the lower electrode and the phase-change material layer, which can be controlled by a process, have been made increasingly.

SUMMARY

Various implementations are provided to a variable resistance memory device capable of reducing a reset current, and a method of manufacturing the same.

In an exemplary implementation, there is provided an exemplary variable resistance memory device. The exemplary variable resistance memory device may include: a multi-layered insulating layer formed on a semiconductor substrate, on which a lower electrode is formed, the multi-layered insulating layer including a first hole and a second hole, concentrically formed therein, to expose the lower electrode, wherein a diameter of the first hole is larger than a diameter of the second hole; a variable resistance material layer formed in the second hole to contact the lower electrode; and an upper electrode formed in the first hole to contact the variable resistance material layer.

In an implementation, there is provided an exemplary method of manufacturing a variable resistance memory device. The exemplary method may include: forming a multi-layered insulating layer by alternately forming a first insulating layer and a second insulating layer on a semiconductor substrate, on which a lower electrode is formed; forming a first hole exposing the lower electrode by etching the multi-layered insulating layer; forming an oxide layer by oxidizing a portion of the second insulating layer; removing the oxide layer so that the first insulating layer protrudes toward the inside of the first hole forming a spacer material, including a void, in the first hole; forming a second hole, exposing the lower electrode, by removing a portion of the spacer material to a certain depth of the first hole; forming a variable resistance material layer in the second hole; and forming an upper electrode in a portion of the first hole from which the spacer material has been removed.

These and other features, aspects, and implementations are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
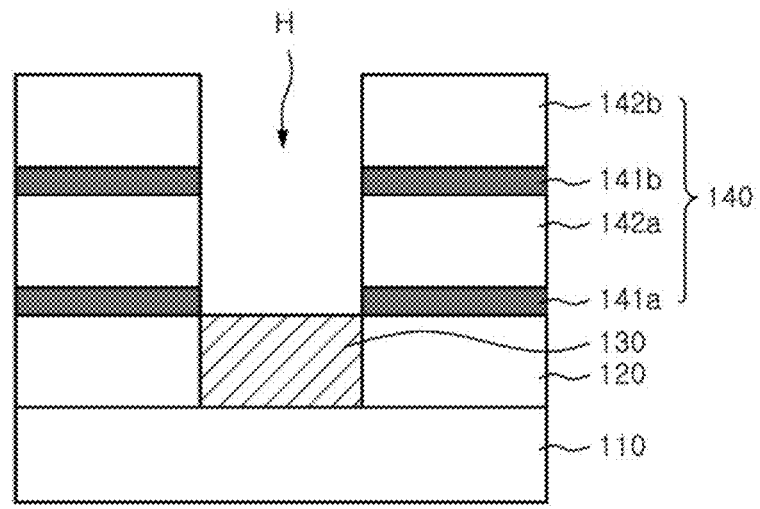
FIGS. 1 to 6 are views illustrating an exemplary method of manufacturing a variable resistance memory device.

Hereinafter, exemplary implementations will be described in greater detail with reference to the accompanying drawings. Exemplary implementations are described herein with reference to cross-sectional illustrations that are schematic illustrations of exemplary implementations and intermediate structures). As such, variations from the shapes of the illustrations as a result, for example, of manufacturing techniques and/or tolerances, are to be expected. Thus, exemplary implementations should not be construed as limited to the particular shapes of regions illustrated herein but may be to include deviations in shapes that result, for example, from manufacturing. In the drawings, lengths and sizes of layers and regions may be exaggerated for clarity. Throughout the disclosure, reference numerals correspond directly to the like numbered parts in the various figures and embodiments of the present invention. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

FIGS. 1 to 6 are views illustrating a method of manufacturing a variable resistance memory device according to an implementation of the inventive concept.

As illustrated in FIG. 1, a first interlayer insulating layer 120 may be formed on a semiconductor substrate 110, and a hole (not shown) may be formed in the first interlayer insulating layer 120. A conductive material may be buried in the inside of the hole to form a lower electrode 130. In an exemplary implementation although not shown, the semiconductor substrate 110 may include a word line and a switching device. A second interlayer insulating layer 140 may be formed on the first interlayer insulating layer 120, in which the lower electrode 130 is formed. Here, the second interlayer insulating layer 140 may be a multi-layered insulating layer in which first material layers 141a and 141b and the second material layers 142a and 142b are alternately stacked. For example, the first material layers 141a and 141b may a include nitride, and the second material layers 142a and 142b may include polysilicon. A resistance change region H exposing an upper surface of the lower electrode 130 is formed in the second interlayer insulating layer 140.

Figure 2:
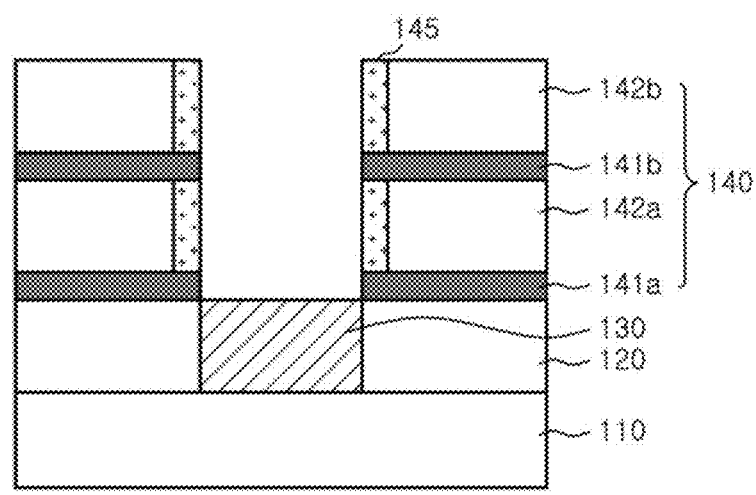

As illustrated in FIG. 2, portions of the second material layers 142a and 142b, which define an outer sidewall of the resistance change region H, may be oxidized to form a sacrificial oxide layer 145.

Figure 3:
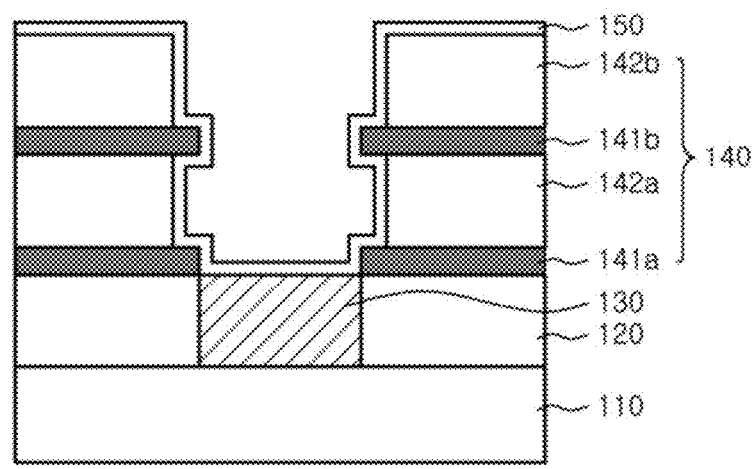

As illustrated in FIG. 3, the sacrificial oxide layer 145 may be etched. An oxide layer 150 may then be deposited along a surface of the resistance change region H and along an upper surface of the second interlayer insulating layer 140. The oxide layer 150 may protect the second material layers 142a and 142b, which define the outer sidewall of the resistance change region H, and prevent leakage. The oxide layer 150 may be deposited, for example, via an atomic layer deposition (ALD) method.

Figure 4:
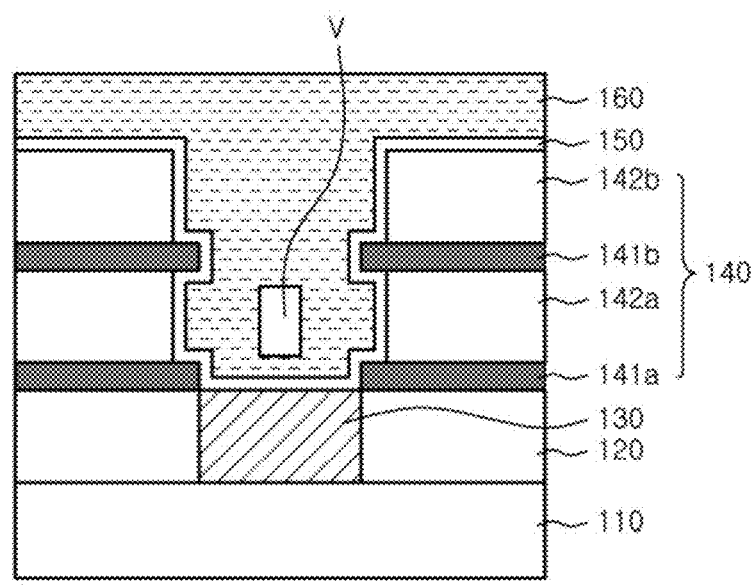

As illustrated in FIG. 4, a spacer material 160 may be formed in the resistance change region H. Since only the second material layers 142a and 142b of the second interlayer insulating layer 140 are oxidized and then etched, the first material layers 141a and 141b of the second interlayer insulating layer 140 have a form protruding toward the inside of the resistance change region H. At this time, because the resistance change region H has a structure in which the protrusion, the burring of the spacer material 160 is not easy. Therefore, the spacer material 160 may be formed in a state in which the spacer material 160 is not completely buried in the inside of the resistance change region H, and a void V is generated in the inside of the resistance change region H. The void V may be generated by a physical shape of the resistance change region H, and a size of the void V may be controlled according to a degree of protrusion of the first material layers 141a and 141b of the second interlayer insulating layer 140. For example, the protrusion of the first material layers 141a and 141b of the second interlayer insulating layer 140 is increased, the size of the void V may be increased. That is, according to a width of oxidation of the second material layers 142a and 142b. The spacer material 160 may include, for example, a nitride.

Figure 5:
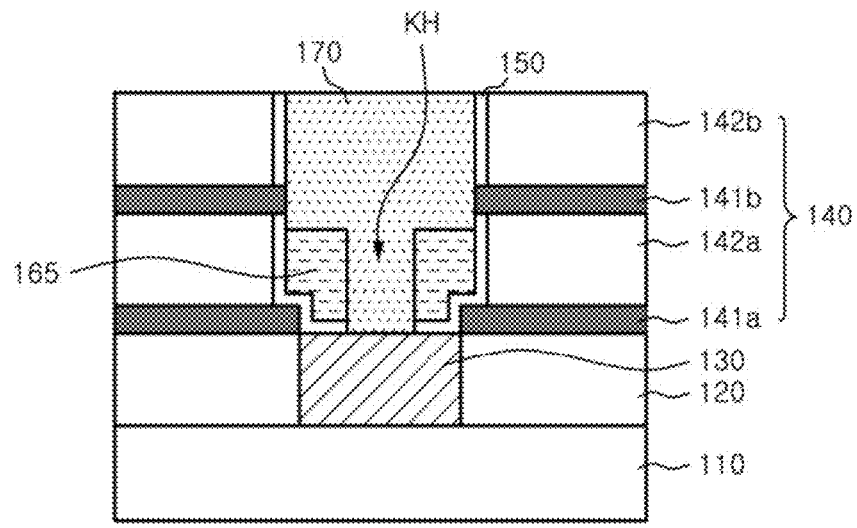

As illustrated in FIG. 5, the spacer material 160 may be etched to a certain height inside of the resistance change region H to form a spacer 165. When a portion of the spacer material 160 is etched, an etching gas, for example $CH_3F$ gas and $O_2$ plasma gas may be used. The etching gas may be transferred into the void V and the spacer material 160 below the void V is also etched to form a key hole KH exposing the lower electrode 130. A variable resistance material 170 may be formed in the key hole KH and the resistance change region H. The variable resistance material 170 may include, for example, $Ge_2Sb_2Te_5$ (GST).

Figure 6:
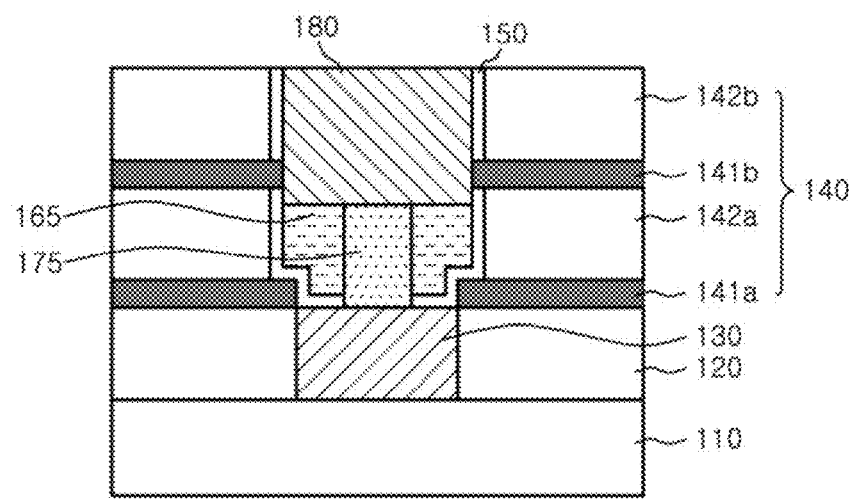

As illustrated in FIG. 6, the variable resistance material 170 may be etched so as to remain only in the key hole KH to form a variable resistance layer 175. An upper electrode 180 may be formed on the variable resistance layer 175 by forming a conductive material in the resistance change region H.

FIGS. 7 to 12 are views illustrating an exemplary method of manufacturing a variable resistance memory device.

Figure 7:
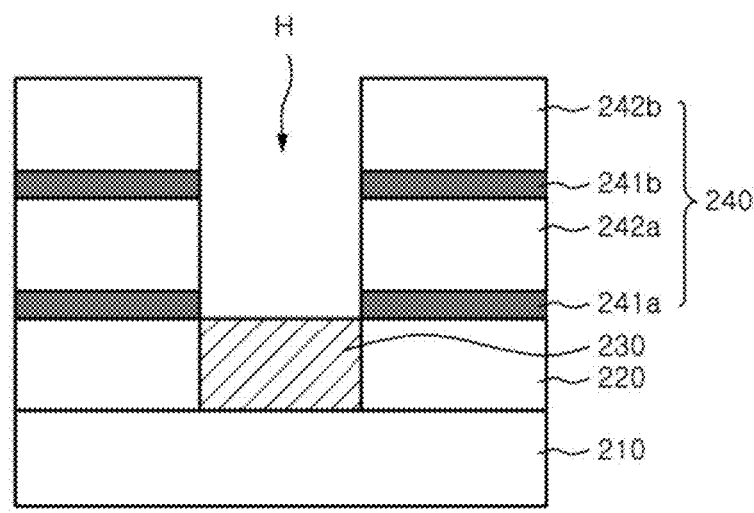
FIGS. 7 to 12 are views illustrating an exemplary method of manufacturing a variable resistance memory device.

As illustrated in FIG. 7, a first interlayer insulating layer 220 may be formed on a semiconductor substrate 210, and a hole (not shown) may be formed in the first interlayer insulating layer 220. A conductive material is buried in the inside of the hole to form a lower electrode 230. In an exemplary implementation, although not shown, the semiconductor substrate 210 may include a word line and a switching device. A second interlayer insulating layer 240 is formed on the first interlayer insulating layer 220, in which the lower electrode 230 is formed. Here, the second interlayer insulating layer 240 may be a multi-layered insulating layer in which first material layers 241a and 241b and the second material layers 242a and 242b are alternately stacked. For example, the first material layers 241a and 241b may include a nitride, and the second material layers 242a and 242b may include polysilicon. A resistance change region H exposing an upper surface of the lower electrode 230 is formed in the second interlayer insulating layer 240.

Figure 8:
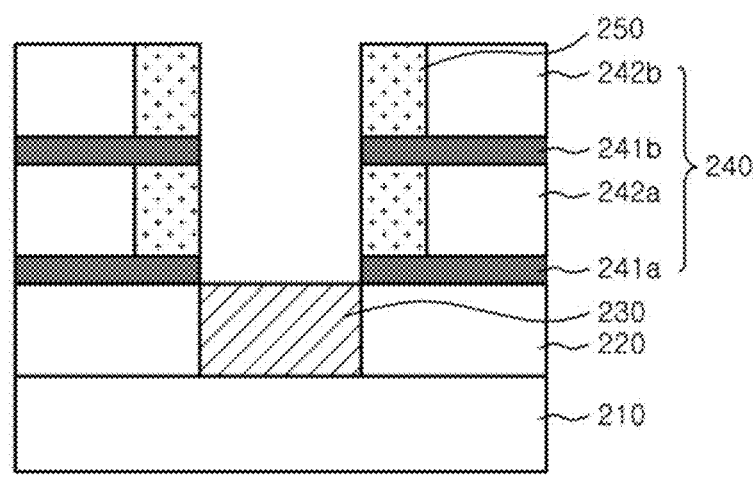

As illustrated in FIG. 8, portions of the second material layers 242a and 242b, which define an outer sidewall of the resistance change region H, may be oxidized to form an oxide buffer layer 250. As compared to FIG. 2, the oxide buffer layer 250 may be formed to have a larger width than the sacrificial oxide layer 145 formed in FIG. 2.

Figure 9:
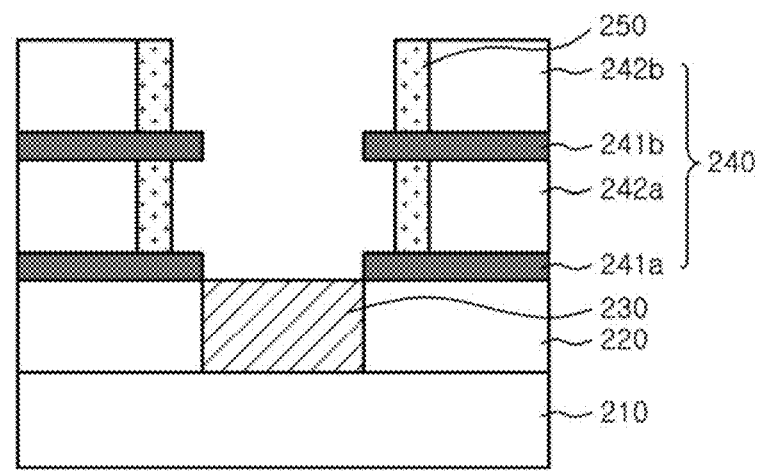

As illustrated in FIG. 9, a portion of the oxide buffer layer 250 may be etched. When the portion of the oxide buffer layer 250 is etched, portions of the first material layers 241a and 241b of the second interlayer insulating layer 240 protrude toward the inside of the resistance change region H.

Figure 10:
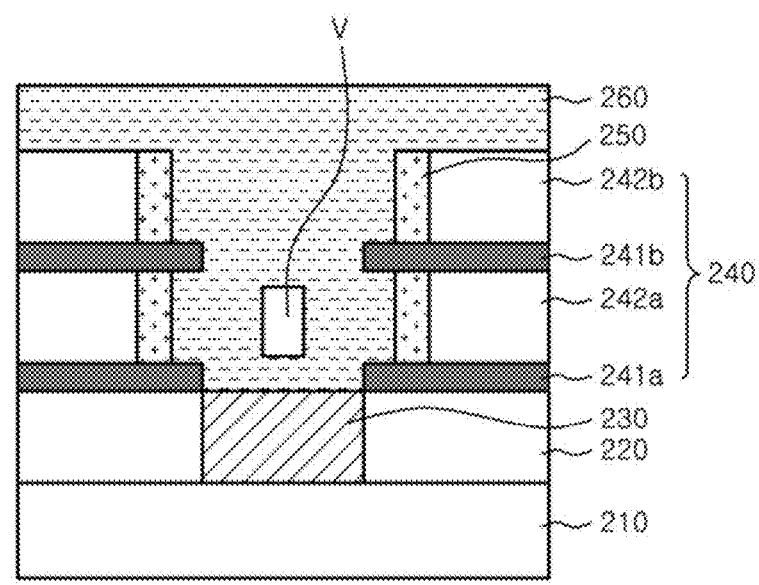

As illustrated in FIG. 10, a spacer material 260 may be formed in the resistance change region H. The first material layers 241a and 241b of the second interlayer insulating layer 240 protrude toward the inside of the resistance change region H. At this time, because the resistance change region H has a structure in which the protrusion, the burring of the spacer material 160 is not easy. Therefore, the spacer material 260 may be formed in a state in which the spacer material 260 is not completely buried in the inside of the resistance change region H, and a void V is generated in the inside of the resistance change region H. The void V may be generated by a physical shape of the resistance change region H, and a size of the void V may be controlled according to a degree of protrusion of the first material layers 241a and 241b of the second interlayer insulating layer 240. For example, the protrusion of the first material layers 141a and 141b of the second interlayer insulating layer 140 is increased, the size of the void V may be increased. That is, according to a width of the oxide layer 250 and a degree of etching of the portion of the oxide layer 250. The spacer material 260 may include, for example, a nitride.

Figure 11:
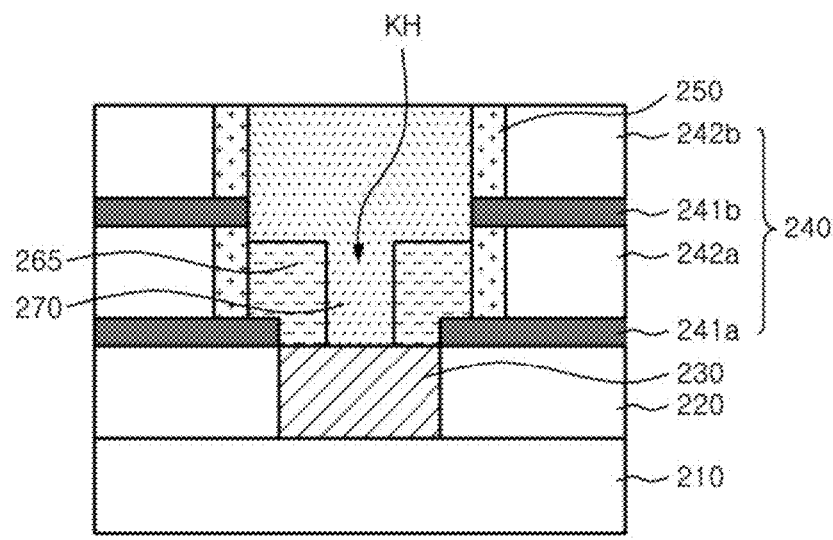

As illustrated in FIG. 11, the spacer material 260 may be etched to a certain height inside of the resistance change region H to form a spacer 265. When a portion of the spacer material 260 is etched, an etching gas, for example $CH_3F$ gas and $O_2$ plasma gas may be used. The etching gas may be transferred into the void V and the spacer material 260 below the void V is also etched to form a key hole KH exposing the lower electrode 230. A variable resistance material 270 may be formed in the insides of the key hole KH and the resistance change region H. The variable resistance material 270 may include, for example, $Ge_2Sb_2Te_5$ (GST).

Figure 12:
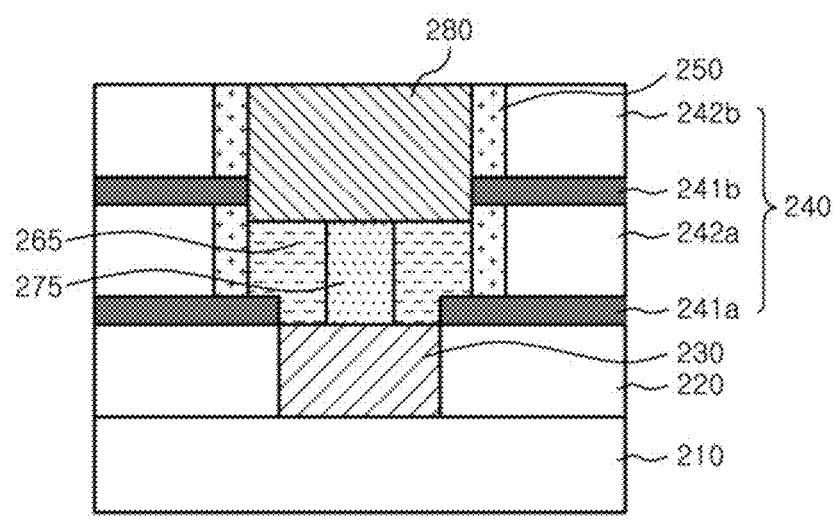

As illustrated in FIG. 12, the variable resistance material 270 may be etched so as to remain only in the key hole KH to form a variable resistance layer 275. An upper electrode 280 may be formed on the variable resistance layer 270 by forming a conductive material in the resistance change region H.

In the variable resistance memory devices according to implementations of the inventive concept, since the lower electrode 130 and 230 and the variable resistance layer 170 and 270 are in contact with each other through the key hole KH, a contact area is reduced, and thus a reset current can be reduced.

The above implementation of the present invention is illustrative and not limitative. Various alternatives and equivalents are possible. The invention is not limited by the implementation described herein. Nor is the invention limited to any specific type of semiconductor device. Other additions, subtractions, or modifications are obvious in view of the present disclosure and are intended to fall within the scope of the appended claims.

What is claimed is:

1. A variable resistance memory device, comprising:
   a multi-layered structure formed on a semiconductor substrate, on which a lower electrode is formed, the multi-layered structure including a first hole and a second hole, concentrically formed therein, to expose the lower electrode, wherein a diameter of the first hole is larger than a diameter of the second hole and a height of the second hole is lower than that of the first hole;
   a variable resistance material layer formed in the second hole to contact the lower electrode;
   an upper electrode formed in the first hole to contact the variable resistance material layer;
   a spacer formed to define the second hole; and
   an oxide layer formed between the multi-layered structure and the upper electrode and between the multi-layered structure and the spacer.

2. The variable resistance memory device of claim 1, wherein the multi-layered structure includes:
   a first layer formed on the semiconductor substrate, the first layer including a first material; and
   a second layer formed on the first layer and including a second material having an etch selectivity that is different than an etch selectivity of the first material, wherein the first layer and the second layer are alternately stacked to form a plurality of layers.

3. The variable resistance memory device of claim 2, wherein the first layer includes a nitride, and the second layer includes polysilicon.

4. The variable resistance memory device of claim 1, wherein the oxide layer is formed from a portion of the second layer that is oxidized.

5. The variable resistance memory device of claim 4, wherein the spacer is formed of a same material as the first layer.

6. A variable resistance memory device, comprising:
   a semiconductor substrate including a lower electrode;
   a multi-layered structure formed on the semiconductor substrate, wherein the multi-layered structure includes a first hole, the first hole extends to the lower electrode; and
   a spacer formed at an inner sidewall of the first hole, wherein a second hole is defined by the spacer and a height of the spacer is lower than that of the first hole;
   a variable resistance material layer formed in the second hole to contact the lower electrode; and
   an oxide layer formed between the multi-layered structure and the spacer.

7. The variable resistance memory device of claim 6, wherein a height of the spacer is same as that of the variable resistance material layer.

8. The variable resistance memory device of claim 6, further comprising:
   an upper electrode formed in the first hole to contact the variable resistance material layer.

9. The variable resistance memory device of claim 8, further comprising:
   an oxide layer formed between the multi-layered structure and the upper electrode.

\* \* \* \* \*